(12) United States Patent
Zhou

(10) Patent No.: US 9,041,441 B2
(45) Date of Patent: May 26, 2015

(54) SEQUENCE CIRCUIT

(71) Applicant: Zhongshan Innocloud Intellectual Property Services Co., Ltd., Zhongshan (CN)

(72) Inventor: Hai-Qing Zhou, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 0 days.

(21) Appl. No.: 14/340,768

(22) Filed: Jul. 25, 2014

(65) Prior Publication Data
US 2015/0028934 A1 Jan. 29, 2015

(30) Foreign Application Priority Data

Jul. 26, 2013 (CN) .......................... 2013 1 0317149

(51) Int. Cl.
*H03L 7/06* (2006.01)
*H03K 17/62* (2006.01)

(52) U.S. Cl.
CPC .... *H03K 17/6242* (2013.01); *H03K 2217/0054* (2013.01)

(58) Field of Classification Search
USPC .......... 327/142, 198, 403, 405, 482–489, 491
See application file for complete search history.

(56) References Cited

U.S. PATENT DOCUMENTS

| | | | | |
|---|---|---|---|---|
| 7,400,188 B2* | 7/2008 | Huang et al. | ................... | 327/543 |
| 7,805,623 B2* | 9/2010 | Jia et al. | ........................ | 713/300 |
| 7,992,025 B2* | 8/2011 | Zou | .............................. | 713/323 |
| 8,314,640 B2* | 11/2012 | Tong et al. | ..................... | 327/142 |
| 2008/0151452 A1* | 6/2008 | Ren | ................................ | 361/86 |
| 2008/0203982 A1* | 8/2008 | Chen et al. | ..................... | 323/266 |
| 2008/0222408 A1* | 9/2008 | Li | .................................... | 713/2 |
| 2008/0258927 A1* | 10/2008 | Chen et al. | .................... | 340/661 |
| 2009/0106574 A1* | 4/2009 | Xiong | ........................... | 713/340 |
| 2012/0033386 A1* | 2/2012 | Lee | ................................ | 361/722 |
| 2012/0146801 A1* | 6/2012 | Zhou | ........................... | 340/654 |
| 2014/0298055 A1* | 10/2014 | Zhou | ............................ | 713/320 |
| 2014/0317426 A1* | 10/2014 | Zhou | ............................ | 713/320 |

* cited by examiner

*Primary Examiner* — Thomas J Hiltunen
(74) *Attorney, Agent, or Firm* — Novak Druce Connolly Bove + Quigg LLP

(57) ABSTRACT

A sequence circuit includes first through third signal terminals, first through ninth resistors, and first through fifth electronic switches. The sequence circuit receives a first signal through the first signal terminal. The sequence circuit receives a second signal through the second signal terminal. The sequence circuit outputs a third signal through the third signal terminal. The sequence circuit is used to ensure the sequence of the first through third signals.

4 Claims, 1 Drawing Sheet

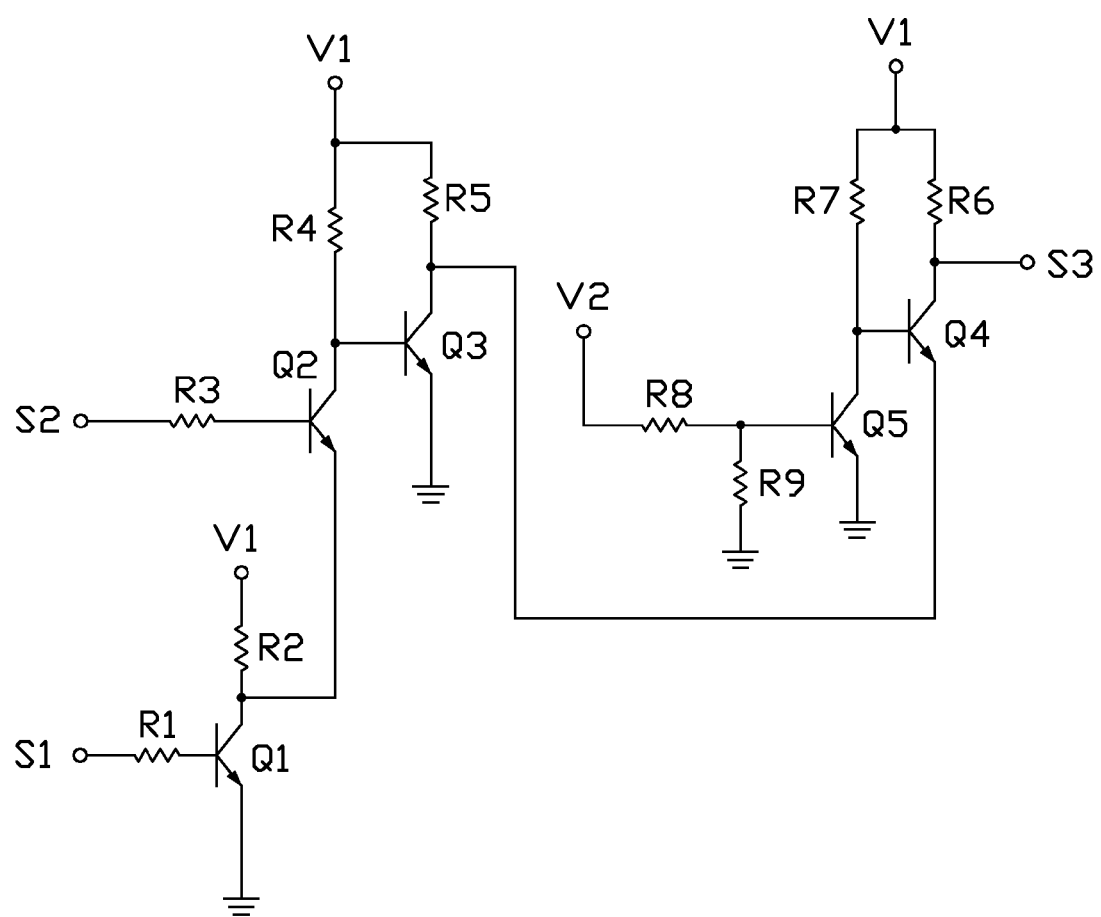

SEQUENCE CIRCUIT

FIELD

The subject matter herein generally relates to a sequence circuit.

BACKGROUND

Most signals for electronic devices are in a particular sequence.

BRIEF DESCRIPTION OF THE DRAWING

Implementations of the present technology will now be described, by way of example only, with reference to the attached FIGURE.

The drawing is a circuit diagram of an embodiment of the sequence circuit.

DETAILED DESCRIPTION

Numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawing is not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a sequence circuit 10.

The drawing illustrates the sequence circuit 10 can comprise resistors R1-R9, electronic switches Q1-Q5, a first signal terminal S1, a second signal terminal S2, a third signal terminal S3, a first power terminal V1, and a second power terminal V2.

The first signal terminal S1 is coupled to a first terminal of the electronic switch Q1 through the resistor R1. A second terminal of the electronic switch Q1 is coupled to ground. A third terminal of the electronic switch Q1 is coupled to a second terminal of the electronic switch Q2. A first terminal of the electronic switch Q2 is coupled to the second signal terminal S2 through the resistor R3. A third terminal of the electronic switch Q2 is coupled to the first power terminal V1 through the resistor R4. The third terminal of the electronic switch Q2 is also coupled to a first terminal of the electronic switch Q3. A second terminal of the electronic switch Q3 is coupled to ground. A third terminal of the electronic switch Q3 is coupled to the first power terminal V1 through the resistor R5. The third terminal of the electronic switch Q3 is also coupled to a second terminal of the electronic switch Q4. A first terminal of the electronic switch Q4 is coupled to a third terminal of the electronic switch Q5. A third terminal of the electronic switch Q4 is coupled to the third signal terminal S3. The third terminal of the electronic switch Q4 is also coupled to the first power terminal V1 through the resistor R6. The third terminal of the electronic switch Q5 is coupled to the first power terminal V1 through the resistor R7. A second terminal of the electronic switch Q5 is coupled to ground. A first terminal of the electronic switch Q5 is coupled to the second power terminal V2 through the resistor R8. The first terminal of the electronic switch Q5 is coupled to ground through the resistor R9. The electronic switch is activated when the first terminal of the electronic switch is at logic 1 and the electronic switch is deactivated when the first terminal of the electronic switch is at logic 0.

The first signal terminal S1, the second signal terminal S2, and the third signal terminal S3 are connected to a chip of a motherboard. The first power terminal V1 and the second power terminal V2 are connected to a power source of the motherboard.

In at least one embodiment, a first signal and a second signal are transmitted to the sequence circuit 10 from the chip of the motherboard. A third signal is transmitted to the chip of the motherboard from the sequence circuit 10. The first signal, the second signal, and the third signal are used to control the motherboard to enter or quit a first mode.

When the motherboard is ready to enter the first mode, no voltage is output to the second power terminal V2 and the electronic switch Q5 is deactivated. The chip of the motherboard outputs the second signal of low level to the sequence circuit 10 through the second signal terminal S2. The electronic switch Q2 is deactivated. The electronic switch Q3 and the electronic switch Q4 are activated. The chip receives the third signal of low level through the third signal terminal S3. After a preset period of time, the chip of the motherboard outputs the first signal of low level to the first signal terminal S1. Thus, when the motherboard is entering the first mode, the first signal, the second signal, and the third signal are at low level. The second signal is earlier than the third signal. The third signal is earlier than the first signal.

When the motherboard is ready to quit the first mode, the chip of the motherboard outputs a first signal of high level to the sequence circuit 10 through the first signal terminal S1. The electronic switch Q1 is activated. After a preset time, the chip of the motherboard outputs the second signal of high level to the sequence circuit 10 through the second signal terminal S2. The electronic switch Q2 is activated. The electronic switch Q3 and the electronic switch Q4 are deactivated. The chip of the motherboard receives the third signal of high level through the third signal terminal S3. Thus, when the motherboard is quitting the first mode, the first signal, the second signal, and the third signal are at high level. The first signal is earlier than the second signal. The second signal is earlier than the third signal.

In at least one embodiment, the electronic switches Q1-Q5 are NPN transistors.

The embodiments shown and described above are only examples. Many details are often found in the art such as the other features of a sequence circuit 10. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A sequence circuit comprising:
    a first electronic switch having a first terminal coupled to a first signal terminal through a first resistor, a second terminal coupled to ground, a third terminal coupled to a first power terminal through a second resistor;
    a second electronic switch having a first terminal coupled to a second signal terminal through a third resistor, a second terminal coupled to a third terminal of the first electronic switch, a third terminal coupled to the first power terminal through a fourth resistor;
    a third electronic switch having a first terminal coupled to the third terminal of the second electronic switch, a second terminal coupled to ground, and a third terminal coupled to the first power terminal through a fifth resistor;
    a fourth electronic switch having a first terminal coupled to the first power terminal through a seventh resistor, a second terminal coupled to the third terminal of the third electronic switch, a third terminal coupled to a third signal terminal, the third terminal also coupled to the first power terminal through a sixth resistor;
    a fifth electronic switch having a first terminal coupled to a second power terminal through an eighth resistor, the first terminal also coupled to ground through a ninth resistor, a second terminal coupled to ground, a third terminal a first terminal of the fourth electronic switch.

2. The sequence circuit of claim 1, wherein the first, second, and third terminals are coupled to a chip of a motherboard, the chip outputs a first signal and a second terminal to the sequence circuit through the first signal terminal and the second terminal respectively, and the sequence circuit outputs a third signal to the chip through the third signal terminal.

3. The sequence circuit of claim 1, wherein the first, second, third, fourth, and fifth electronic switches are NPN transistors.

4. The sequence circuit of claim 2, wherein the first power terminal and the second power terminal are coupled to a power source of the motherboard.

* * * * *